United States Patent
Qin (10) Patent No.: US 10,707,353 B2
(45) Date of Patent: Jul. 7, 2020

(54) THIN FILM TRANSISTOR, METHOD FOR FABRICATING THE SAME, DISPLAY SUBSTRATE AND DISPLAY DEVICE

(71) Applicant: BOE TECHNOLOGY GROUP CO., LTD., Beijing (CN)

(72) Inventor: Wei Qin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/765,473

(22) PCT Filed: Jul. 13, 2017

(86) PCT No.: PCT/CN2017/092748
§ 371 (c)(1),
(2) Date: Apr. 2, 2018

(87) PCT Pub. No.: WO2018/032918
PCT Pub. Date: Feb. 22, 2018

(65) Prior Publication Data
US 2018/0308980 A1      Oct. 25, 2018

(30) Foreign Application Priority Data

Aug. 19, 2016  (CN) .......................... 2016 1 0698433

(51) Int. Cl.
*H01L 29/786*     (2006.01)
*H01L 27/12*      (2006.01)
(Continued)

(52) U.S. Cl.
CPC ...... *H01L 29/7869* (2013.01); *H01L 27/1225* (2013.01); *H01L 29/41733* (2013.01);
(Continued)

(58) Field of Classification Search
CPC ............. H01L 27/1214; H01L 27/1248; H01L 29/41733; H01L 29/42384; H01L 29/4908;
(Continued)

(56) References Cited

U.S. PATENT DOCUMENTS

| | | | | |
|---|---|---|---|---|
| 2006/0110866 A1* | 5/2006 | Gan | ..................... | H01L 29/4908 438/151 |
| 2006/0163559 A1* | 7/2006 | Koganei | ............. | H01L 51/0021 257/40 |

(Continued)

FOREIGN PATENT DOCUMENTS

| CN | 1641451 A | 7/2005 |
|---|---|---|
| CN | 1768437 A | 5/2006 |

(Continued)

OTHER PUBLICATIONS

International Search Report received for PCT Patent Application No. PCT/CN2017/092748, dated Oct. 20, 2017, 5 pages (2 pages of English Translation and 3 pages of Original Document).

(Continued)

*Primary Examiner* — David C Spalla
(74) *Attorney, Agent, or Firm* — Womble Bond Dickinson (US) LLP (57) ABSTRACT

A TFT, a method for fabricating the same, a display substrate, and a display device are disclosed. The TFT comprises a substrate, a gate, a gate insulating layer, semiconductor layer, a source, and a drain. The gate comprises a rough surface on a side facing the semiconductor layer. Since the surface of gate is uneven, the light which has been reflected on the surface of gate will no longer be reflected, or will be directly scattered to other directions. The incident light from the backlight source cannot impinge onto the semiconductor layer by continuous reflection. This reduces (Continued)

the possibility that the semiconductor layer is irradiated by light, and improves stability of TFT.

18 Claims, 3 Drawing Sheets

(51) Int. Cl.
    *H01L 29/417*     (2006.01)
    *H01L 29/66*     (2006.01)
    *H01L 29/423*     (2006.01)

(52) U.S. Cl.
    CPC ...... *H01L 29/423* (2013.01); *H01L 29/42384* (2013.01); *H01L 29/66742* (2013.01); *H01L 29/66765* (2013.01); *H01L 29/66969* (2013.01); *H01L 29/78633* (2013.01); *H01L 29/78669* (2013.01); *H01L 29/78678* (2013.01)

(58) Field of Classification Search
    CPC ......... H01L 29/66742; H01L 29/66765; H01L 29/78669; H01L 29/78678
    See application file for complete search history.

(56) References Cited

U.S. PATENT DOCUMENTS

| | | |
|---|---|---|
| 2009/0140259 A1 | 6/2009 | Yamazaki |
| 2009/0159879 A1 | 6/2009 | Jeong et al. |
| 2009/0159884 A1* | 6/2009 | Oda ................... H01L 29/4908 257/57 |
| 2016/0380239 A1 | 12/2016 | Xu |

FOREIGN PATENT DOCUMENTS

| | | |
|---|---|---|
| CN | 104952791 A | 9/2015 |
| CN | 105008593 A | 10/2015 |
| CN | 106229344 A | 12/2016 |
| JP | 10-200120 A | 7/1998 |
| JP | 11-204798 A | 7/1999 |
| KR | 10-2006-0001745 A | 1/2006 |
| KR | 20060001745 A * | 1/2006 |
| KR | 10-2009-0068939 A | 6/2009 |
| WO | 2018/032918 A1 | 2/2018 |

OTHER PUBLICATIONS

Written Opinion received for PCT Patent Application No. PCT/CN2017/092748, dated Oct. 20, 2017, 6 pages (2 pages of English Translation and 4 pages of Original Document).

Office Action received for Chinese Patent Application No. 201610698433.8, dated Sep. 4, 2018, 16 pages (8 pages of English Translation and 8 pages of Office Action).

Office Action received for Chinese Patent Application No. 201610698433.8, dated Apr. 29, 2019, 20 pages (11 pages of English Translation and 9 pages of Office Action).

* cited by examiner

Fig. 8B

THIN FILM TRANSISTOR, METHOD FOR FABRICATING THE SAME, DISPLAY SUBSTRATE AND DISPLAY DEVICE

RELATED APPLICATIONS

The present application is the U.S. national phase entry of PCT/CN2017/092748, with an international filing date of Jul. 13, 2017, which claims the benefit of Chinese Patent Application No. 201610698433.8, filed on Aug. 19, 2016, the entire disclosures of which are incorporated herein by reference.

TECHNICAL FIELD

The present disclosure relates to the field of transistor, and particularly to a thin film transistor (TFT), a method for fabricating the same, a display substrate, and a display device.

BACKGROUND

A TFT is a field effect semiconductor device, and comprises important portions like a substrate, a gate, a gate insulating layer, an active layer, a source, and a drain. The active layer plays a key role in the device performance and the fabricating process. In a recent decade, a liquid crystal display device in which a Si-TFT is used as the driving unit has developed rapidly and become a popular information display terminal, due to its advantages of small volume, light weight, and high quality. However, amorphous silicon has the disadvantages of low field-effect mobility, sensitive to light, and opacity of material, while the process for fabricating a polycrystalline silicon TFT with a large area is complex and a low temperature process is difficult to realize.

However, in the current TFT, an oxide semiconductor in the active layer degrades if exposed to light. Under irradiation by a backlight source, light passes through a substrate impinges on a source and drain metal layer, and then reflects to impinge on a gate metal layer. This continuous reflection causes light to impinge on a semiconductor layer. Since the semiconductor layer is extremely sensitive to light, the characteristics of the TFT will degrade significantly after irradiation for a long time.

SUMMARY

Embodiments of the present disclosure provide a thin film transistor, comprising a substrate, a gate, a gate insulating layer, a semiconductor layer, a source, and a drain, wherein the gate comprises a rough surface on a side facing the semiconductor layer.

For example, the thin film transistor has a bottom gate configuration. The gate is arranged on the substrate, the gate insulating layer covers the gate and the substrate, the semiconductor layer is arranged on the gate insulating layer, a projection of the semiconductor layer on the substrate falls within a projection of the gate on the substrate, and the source and the drain are arranged on the semiconductor layer.

For example, the thin film transistor has a top gate configuration. The semiconductor layer is arranged on the substrate, the source and the drain are arranged on the semiconductor layer, the gate insulating layer covers the source and the drain, the semiconductor layer and the substrate, the gate is arranged on the gate insulating layer, and the projection of the semiconductor layer on the substrate falls within the projection of the gate on the substrate.

For example, a surface of the gate insulating layer facing the gate is rough.

For example, the semiconductor layer comprises a metallic oxide, a-Si or p-Si.

The gate comprises a rough surface on a side facing the semiconductor layer.

For example, the rough surface of the gate has a surface roughness about 20~100 nm.

For example, the thin film transistor further comprises a buffer layer between the gate and the gate insulating layer.

For example, the buffer layer comprises an electrically conductive material.

Embodiments of the present disclosure further provide a display substrate, comprising the thin film transistor as described in the above embodiments.

Embodiments of the present disclosure further provide a display device, comprising the display substrate as described in the above embodiments.

Embodiments of the present disclosure provide a method for fabricating a thin film transistor, comprising: forming a gate, a gate insulating layer, a semiconductor layer, a source, and a drain on a substrate, wherein forming the gate comprises forming a gate which comprises a rough surface on a side facing the semiconductor layer.

For example, forming the gate, the gate insulating layer, the semiconductor layer, the source, and the drain comprises: forming the gate on the substrate; forming the gate insulating layer which covers the gate and the substrate; forming the semiconductor layer on the gate insulating layer, wherein a projection of the semiconductor layer on the substrate falls within a projection of the gate on the substrate; and forming the source and the drain on the semiconductor layer.

For example, forming the gate on the substrate comprises: depositing a gate metal layer on the substrate; micro-etching the gate metal layer to form a rough surface on a side away from the substrate, wherein the surface has a surface roughness of about 20~100 nm; and patterning the gate metal layer to form a gate which comprises a rough surface on a side away from the substrate.

For example, prior to forming the gate insulating layer, the method further comprises: forming a buffer layer which covers the gate.

For example, forming the gate and the buffer layer comprises: depositing a gate metal layer on a substrate; micro-etching the gate metal layer, so that a surface of the gate metal layer on a side away from the substrate is rough; depositing an electrically conductive material layer on the surface of the gate metal layer; and patterning the gate metal layer and the electrically conductive material layer to form the gate and the buffer layer which covers the gate.

For example, micro-etching the gate metal layer comprises: etching a surface of the gate metal layer on a side away from the substrate with a weak acidic solution or oxidizing agent.

For example, micro-etching comprises: etching the gate metal layer by using hydrogen peroxide with a mass concentration of about 1~3% for a duration of about 10 seconds~10 minutes.

For example, forming the gate, the gate insulating layer, the semiconductor layer, the source, and the drain comprises: forming the semiconductor layer on the substrate; forming the source and the drain on the semiconductor layer; forming the gate insulating layer which covers the source, the drain, the semiconductor layer, and the substrate; and forming the gate on the gate insulating layer, wherein the projection of the semiconductor layer on the substrate falls within the projection of the gate on the substrate.

For example, after forming the gate insulating layer, and prior to forming the gate, the method further comprises: processing the gate insulating layer with a plasma gas, so that a surface of the gate insulating layer away from the substrate is rough.

DETAILED DESCRIPTION OF EMBODIMENTS

The display substrate, the method for fabricating the same, the display panel, and the display apparatus in embodiments of the present disclosure will be described in detail hereinafter with reference to the accompanying drawing.

Reference numerals: 1 backlight source; 2 light; 3 substrate; 4 gate insulating layer; 5 gate; 6 source or drain; 7 semiconductor layer; 8 rough surface of gate; 9 buffer layer; 10 rough surface of gate insulating layer; 11 light shielding layer.

In a known TFT, when a backlight source irradiates the TFT, light emitted from the backlight source passes through a substrate and a transparent gate insulating layer, and directly impinges onto the source or the drain. The light irradiating the source or the drain is reflected onto the gate. The light is subject to continuous reflection between the source or the drain and the gate, and impinges on the semiconductor layer. The semiconductor layer is relatively sensitive to light. Especially when the semiconductor material is a metallic oxide, the oxide semiconductor layer is very sensitive to light. Once the semiconductor layer is exposed to light for a long time, the TFT will suffer from significant degradation in performance. Therefore, embodiments of the present disclosure intend to alleviate or eliminate one or more of these problems.

Embodiments of the present disclosure provide a TFT, comprising a substrate, gate, a gate insulating layer, a semiconductor layer, a source, and a drain. The gate comprises a rough surface on a side facing the semiconductor layer.

For example, the TFT is a bottom gate type, and comprises a substrate; a gate which is arranged on the substrate; the gate comprises a rough surface on a side away from the substrate; a gate insulating layer; a semiconductor layer which is arranged on the gate insulating layer, a projection of the semiconductor layer on the substrate falls within a projection of the gate on the substrate; and the source and drain are arranged on the semiconductor layer.

Figure 1:
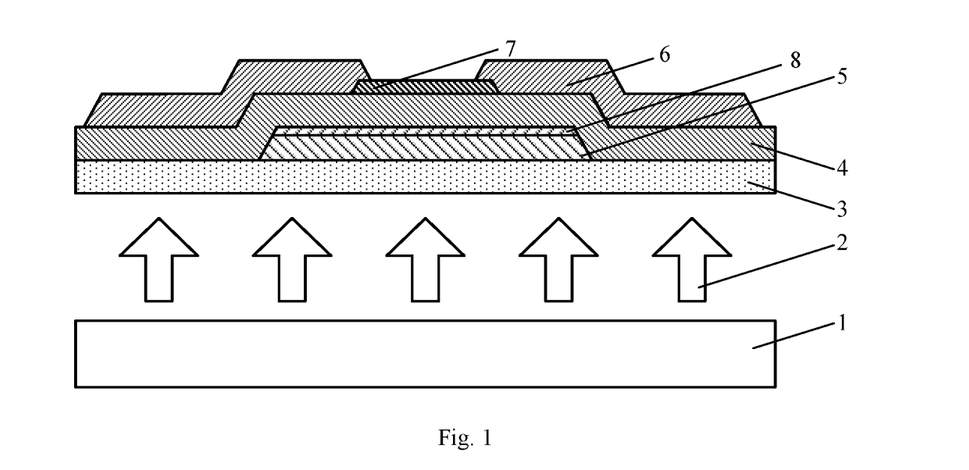
FIG. 1 is a structural view for illustrating a TFT in an embodiment of the present disclosure.

FIG. 1 is a structural view of a TFT in an embodiment of the present disclosure. A substrate 3 for example is a glass substrate. A gate insulating layer 4 comprises silicon oxide, and is transparent. A gate 5 comprises a metallic material. A source or drain 6 comprises a metallic material. A semiconductor layer 7 comprises indium gallium zinc oxide or indium zinc oxide. The gate 5 comprises a rough surface 8.

In the embodiment shown in FIG. 1, the TFT is a bottom gate type. The TFT comprises the substrate 3; the gate 5 which is arranged on the substrate 3; the gate 5 comprises the rough surface 8 on a side away from the substrate 3; the gate insulating layer 4; the semiconductor layer 7 which is arranged on the gate insulating layer 4, a projection of the substrate 3 on the semiconductor layer 7 falls within a projection of the gate 5 on the substrate 4; and the source and drain 6 which is arranged on the semiconductor layer 7.

Embodiments of the present disclosure provide a TFT, a method for fabricating the same, a display substrate, and a display device, which effectively reduce reflectivity of the gate, reduce the possibility that the semiconductor layer is irradiated by light, improve stability of TFT, and extend lifetime of the display device.

According to embodiments of the present disclosure, the gate 5 is modified, so that the gate 5 comprises the rough surface 8 on a side facing the semiconductor layer 7. As for the bottom gate TFT shown in FIG. 1, the gate 5 comprises the rough surface on the side facing the semiconductor layer 7, i.e., on the side away from the substrate 3. The rough surface indicates an uneven structure, and for example is characterized with a surface roughness. For example, the rough surface 8 has a surface roughness Ra of about 20~100 nm. The rough surface 8 has a poor performance for reflecting light, and can effectively avoid light from impinging onto the semiconductor layer 7 after reflection.

For example, the gate 5 comprises a metal such as Cu, Al, Ag, Mo, Cr, Nd, Ni, Mn, Ti, Ta, W, and an alloy of these metals. The present disclosure is not limited in this regard. In an example, the gate for example comprises Cu.

The rough surface of the gate for example is formed by micro-etching. The micro-etching process for example comprises: etching a surface of the gate metal layer on a side away from the substrate with a weak acidic solution or oxidizing agent. An etching solution for the micro-etching is selected according to the material of gate, as long as an uneven surface can be formed. In an example, Cu is used to form the gate, hydrogen peroxide with a mass concentration of about 1~3% is used to etch the gate for a duration of about 10 seconds~10 minutes.

Figure 2:
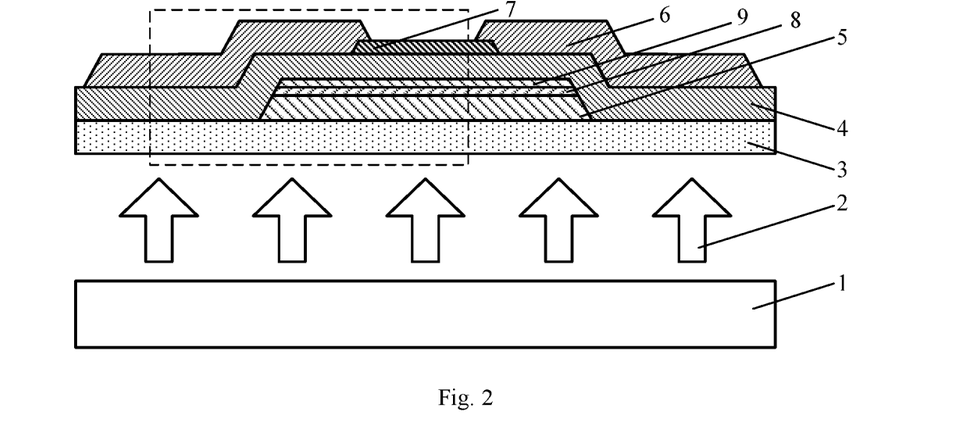
FIG. 2 is a structural view for illustrating a TFT in an embodiment of the present disclosure.

FIG. 2 is a structural view for an oxide TFT in an embodiment of the present disclosure. The embodiment shown in FIG. 2 differs from the embodiment shown in FIG. 1 in that, a buffer layer 9 is further arranged on the rough surface 8 of the gate 5.

Since the gate 5 comprises the rough surface 8, ions from the gate 5 may enter the gate insulating layer 4 and the semiconductor layer 7, thus affecting performance of the TFT. Therefore, the buffer layer 9 is further arranged between the gate 5 and the gate insulating layer 4. The buffer layer 9 effectively avoids metal ions from the gate 5 from entering the gate insulating layer 4 and the semiconductor layer 7.

The buffer layer 9 for example comprises an electrically conductive material, especially a transparent electrically conductive material. In an example, the buffer layer 9 comprises indium gallium zinc oxide, indium tin oxide, or indium zinc oxide.

Figure 3:
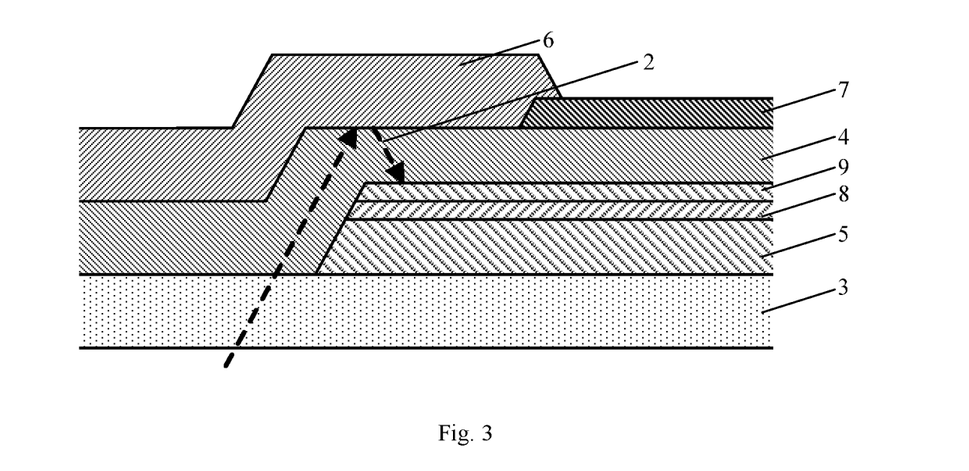
FIG. 3 is a diagram for illustrating incidence and reflection of light when a backlight source irradiates a TFT in an embodiment of the present disclosure.

FIG. 3 is a diagram for illustrating incidence and reflection of light when a backlight source irradiates a TFT in an embodiment of the present disclosure. FIG. 3 is an enlarged view for the dashed region in FIG. 2. When light 2 passes through the gate insulating layer 4 and impinges onto the gate 5, since the gate 5 comprises the rough surface 8, reflection of light is avoided, the possibility of light impinging onto the semiconductor layer 7 is reduced, and the stability TFT is facilitated.

In embodiments of the present disclosure, the semiconductor layer for example comprises an oxide semiconductor, a-Si, or p-Si. Since the oxide semiconductor is relatively sensitive to light, embodiments of the present disclosure have pronounced effects for increasing stability of a TFT in which an oxide semiconductor is used as a semiconductor layer.

In the TFT, the substrate for example is a glass substrate, a quartz substrate, or a flexible substrate of e.g., polyimide. The gate insulating layer for example is made from silicon oxide or organic resin. The gate insulating layer of an organic resin tends to form a more flat upper surface, and avoids the oxide semiconductor layer from being affected by surface roughness of the gate surface. An organic resin is used as a gate insulating layer to form a flexible display device.

The source and drain on the oxide semiconductor layer for example comprise a metal like Cu, Al, Ag, Mo, Cr, Nd, Ni, Mn, Ti, Ta, W, and alloys of these metals. The source and drain metal layer for example is a monolayer structure or multilayer structure, and the multilayer structure comprises Cu\Mo, Ti\Cu\Ti, Mo\Al\Mo, or the like.

Embodiments of the present disclosure further provide a method for fabricating a TFT, comprising: providing a substrate; forming a gate comprising a rough surface on a side away from the substrate on the substrate; forming a gate insulating layer; forming a semiconductor layer on the gate insulating layer, a projection of the semiconductor layer on the substrate falls within a projection of the gate on the substrate; forming a source and a drain to obtain the TFT.

Furthermore, forming the gate comprising the rough surface on the substrate comprises: depositing a gate metal layer on a substrate; micro-etching the gate metal layer to form a gate metal layer comprises a rough surface on a side away from the substrate, the surface having a surface roughness Ra of about 20~100 nm; and patterning the gate metal layer to form a gate comprising a rough surface on a side away from the substrate.

During forming the gate comprising the rough surface, a physical sputtering or other deposition methods known by the ordinary skilled in the art is used to deposit the gate metal layer on the substrate. The gate metal layer for example has a thickness of about 300~400 nm.

The micro-etching for example comprises: etching the surface of the gate metal layer on a side away from the substrate with a weak acidic solution or oxidizing agent. The etching solution for the micro-etching is selected according to the material of gate, as long as an uneven surface can be formed. In an example, Cu is used to form the gate, hydrogen peroxide with a mass concentration of about 1~3% is used to etch the gate for a duration of about 10 seconds~10 minutes, for example about 1~2 minutes. In the present disclosure, the surface roughness of the gate surface is controlled by the solution and etching duration in the micro-etching, so as to better avoid light reflection.

In order to prevent metal ions from the gate with the rough surface from entering the gate insulating layer and the semiconductor layer, for example a buffer layer is further formed on the semiconductor layer. Namely: prior to forming the gate insulating layer, the method further comprises forming a buffer layer which covers the gate.

Furthermore, forming the gate and the buffer layer comprises: depositing a gate metal layer on a substrate; micro-etching the gate metal layer to form a rough surface for the gate metal layer on a side away from the substrate; depositing an electrically conductive material layer on the surface of the gate metal layer; and patterning the gate metal layer and the electrically conductive material layer to form the gate and the buffer layer which covers the gate.

The electrically conductive material layer for example comprises a transparent electrically conductive material, such as indium gallium zinc oxide, indium tin oxide, or indium zinc oxide.

Figure 4:
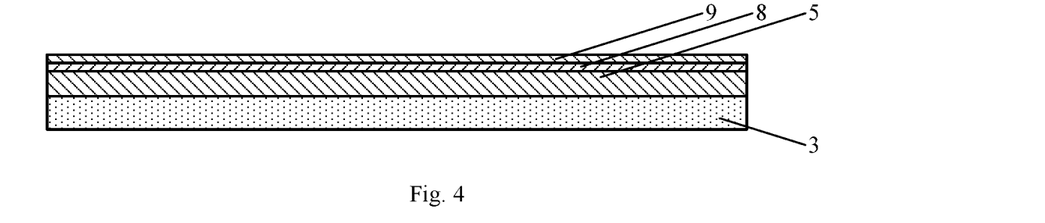
FIG. 4 is a view of a structure in which a gate metal layer and an electrically conductive material layer have been formed in an embodiment of the present disclosure.

FIG. 4 is a view of a structure in which a gate metal layer and an electrically conductive material layer have been formed. As shown, the gate metal layer is deposited on the substrate 3, the gate metal layer is micro-etched to form the gate 5 comprising the rough surface 8, and to form the buffer layer 9 which covers the gate 5.

Figure 5:
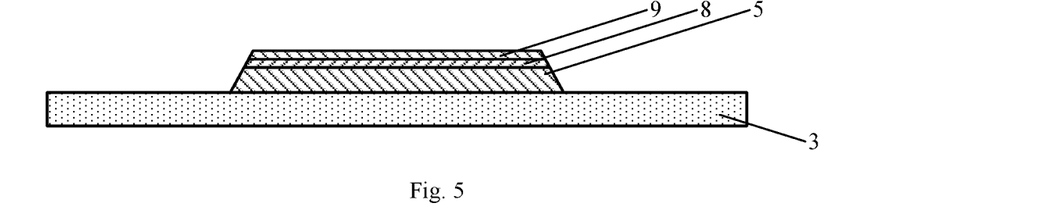
FIG. 5 is a view of a structure in which the gate metal layer and the electrically conductive material layer are patterned to form a gate and a buffer layer in an embodiment of the present disclosure.

FIG. 5 is a view of a structure in which the gate metal layer and the electrically conductive material layer are patterned to form a gate and a buffer layer. As shown, the structure shown in FIG. 4 is patterned to form the gate 5 which comprises the rough surface 8 and the buffer layer 9 which covers the gate 5.

In embodiments of the present disclosure, the semiconductor layer for example comprises an oxide semiconductor, a-Si, or p-Si. Embodiments of the present disclosure are not limited in aspects regarding the method for forming the gate insulating layer, the semiconductor layer, the source, and the drain.

In the above embodiments, reference is made to a TFT of a bottom gate type. It is noted that, the concept of the present disclosure is also applicable to a TFT of a top gate type.

Figure 6:
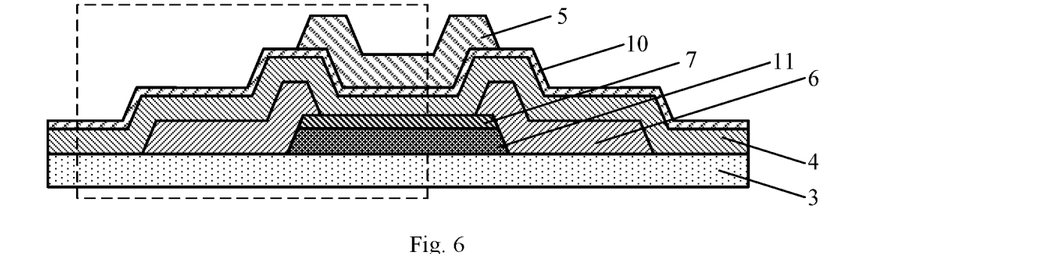
FIG. 6 is a structural view for illustrating a TFT in an embodiment of the present disclosure.

FIG. 6 schematically shows a TFT of a top gate type. As shown, the TFT comprises the substrate 3; the semiconductor layer 7 on the substrate 3; the source and drain 6 on the semiconductor layer 7; the gate insulating layer 4 which covers the source and drain 6 and the semiconductor layer 7; and the gate 5 on the gate insulating layer 4, the gate 5 comprises a rough surface on a side facing the semiconductor layer 7.

In an embodiment, a light shielding layer 11 is further arranged between the substrate 3 and the semiconductor layer 7. The light shielding layer 11 generally is an opaque metal layer. The light shielding layer 11 blocks light from the backlight source from directly impinging onto the semiconductor layer.

Similar with the embodiment shown in FIG. 2, the TFT for example further comprises a buffer layer (not shown) between the rough surface 10 of the gate insulating layer 4 and the gate 5. The buffer layer effectively avoids metal ions from the subsequently formed gate from entering the gate insulating layer 4, and thus entering the semiconductor layer 7.

The method for fabricating a TFT comprises: providing the substrate 3; forming the light shielding metal layer 11 and the semiconductor layer 7 on the substrate 3 in this order; forming the source and drain 6 on the semiconductor layer 7; forming the gate insulating layer 4 on the source and the drain 6 and the semiconductor layer 7, the gate insulating layer 4 comprising the rough surface 10 on a side away from the substrate 3; and forming the gate 5 on the gate insulating layer 4 comprising the rough surface 10. The gate 5 comprises a rough surface (not shown) on a side facing the semiconductor layer 7.

In an embodiment, an opaque metal layer and a semiconductor layer are deposited on the substrate 3 in this order, and then a patterning process is performed to form a stack of the light shielding layer 11 and the semiconductor layer 7.

In this method, the gate insulating layer comprising a rough surface is formed, so that the gate deposited on the gate insulating layer comprises a rough surface. The process for forming the rough surface for example comprises a plasma gas process.

Figure 7:
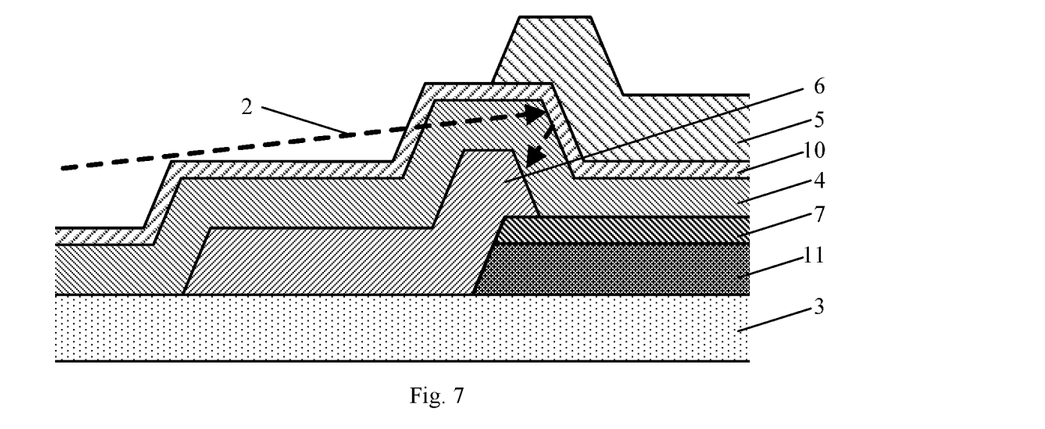
FIG. 7 is a diagram for illustrating incidence and reflection of light when a backlight source irradiates a TFT in an embodiment of the present disclosure.

FIG. 7 is a diagram for illustrating incidence and reflection of light when a backlight source irradiates a TFT in an embodiment of the present disclosure. FIG. 7 is an enlarged view for the dashed region in FIG. 6. When light 2 passes through the gate insulating layer 4 and impinges onto the gate 5, since the gate 5 comprises the rough surface 8, reflection of light is avoided, the possibility of light impinging onto the semiconductor layer 7 is reduced, and the stability TFT is facilitated The present disclosure further provides a display substrate, comprising the TFT as described in the above embodiments.

The present disclosure further provides a display device, comprising the display substrate as described in the above embodiments.

The TFT and the method for fabricating the same will be described with reference to the following embodiments, and the scope of the present disclosure is not limited to these embodiments.

In an embodiment of the present disclosure, the method for fabricating a TFT comprises the following steps 11-16.

Step 11, a substrate is provided. The substrate can be glass or quartz.

Step 12, a gate is formed on the above substrate. In particular, a gate metal layer is deposited on the substrate from step 11 sputtering or thermal evaporation. The gate metal layer has a thickness of about 300~400 nm, and is formed of Cu.

Step 13, the gate metal layer is etched by hydrogen peroxide with a mass concentration of 3% for an etching duration of 2 minutes, so as to form a gate metal layer comprising an uneven structure on a surface away from the substrate. The surface has a surface roughness Ra of about 20~100 nm.

Step 14, a gate insulating layer is formed on the substrate from step 13. In particular, a gate insulating layer is deposited on the substrate from step 13 by plasma enhanced chemical vapor deposition (PECVD). The gate insulating layer comprises oxide, nitride, or oxynitride, and the reaction gas comprises $SiH_4$, $NH_3$ and $N_2$, or $SiH_2Cl_2$, $NH_3$ and $N_2$, respectively.

Step 15, an oxide semiconductor layer is deposited on the substrate from step 14. The oxide semiconductor for example comprises indium zinc oxide, zinc tin oxide, or indium gallium zinc oxide.

Step 16, a pattern comprising data lines, a source electrode, and a drain electrode is formed on the substrate from step 15. In particular, a source and drain metal layer is deposited on the substrate from step 15 by magnetron sputtering, thermal evaporation or other film-forming methods. The source and drain metal layer for example comprises metals like Cu, Al, Ag, Mo, Cr, Nd, Ni, Mn, Ti, Ta, W and alloys of these metals. The source and drain metal layer for example is a monolayer structure or a multilayer structure, and the multilayer structure for example comprises Cu\Mo, Ti\Cu\Ti, Mo\Al\Mo. A photoresist is coated on the source and drain metal layer and is exposed with a mask, so that the photoresist forms a photoresist non-retained region and a photoresist retained region. The photoresist retained region corresponds to a region where a pattern comprising the source electrode, the drain electrode and data lines is located, and the photoresist non-retained region corresponds to a region other than the above pattern. A development process is performed, so that photoresist in the photoresist non-retained region is completely removed, and the thickness of photoresist in the photoresist retained region is constant. The source and drain metal layer in the photoresist non-retained region is completely etched away by an etching process, and the remaining photoresist is lifted off, so as to form the drain electrode, the source electrode and data lines.

In an embodiment of the present disclosure, the method for fabricating a TFT comprises the following steps 21-26.

Step 21, a substrate is provided. The substrate can be glass or quartz.

Step 22, a gate is formed on the above substrate. In particular, a gate metal layer is deposited on the substrate from step 21 sputtering or thermal evaporation. The gate metal layer has a thickness of about 300~400 nm, and is formed of Cu.

Step 23, the gate metal layer is etched by hydrogen peroxide with a mass concentration of 1% for an etching duration of 1 minute, so as to form a gate metal layer comprising an uneven structure on a surface away from the substrate. The surface has a surface roughness Ra of about 20~100 nm. A transparent conductive layer is deposited on the surface of the gate metal layer comprising the rough surface. The transparent conductive layer comprises indium tin oxide. A patterning process is performed on the gate metal layer and the transparent conductive layer, to form a gate with a rough surface and a buffer layer covering the gate.

Step 24, a gate insulating layer is formed on the substrate from step 23. In particular, the gate insulating layer is deposited on the substrate from step 23 by PECVD. The gate insulating layer comprises oxide, nitride, or oxynitride, and the reaction gas comprises $SiH_4$, $NH_3$ and $N_2$, or $SiH_2Cl_2$, $NH_3$ and $N_2$, respectively.

Step 25, an oxide semiconductor layer is deposited on the substrate from step 24. The oxide semiconductor for example comprises indium zinc oxide, zinc tin oxide, or indium gallium zinc oxide.

Step 26, a pattern comprising data lines, a source electrode, and a drain electrode is formed on the substrate from step 25. In particular, a source and drain metal layer is deposited on the substrate from step 25, by magnetron sputtering, thermal evaporation or other film-forming methods. The source and drain metal layer for example comprises metals like Cu, Al, Ag, Mo, Cr, Nd, Ni, Mn, Ti, Ta, W and alloys of these metals. The source and drain metal layer for example is a monolayer structure or multilayer structure, and the multilayer structure for example comprises Cu\Mo, Ti\Cu\Ti, Mo\Al\Mo. A photoresist is coated on the source and drain metal layer and is exposed with a mask, so that the photoresist forms a photoresist non-retained region and a photoresist retained region. The photoresist retained region corresponds to a region where a pattern comprising the source electrode, the drain electrode and data lines is located, and the photoresist non-retained region corresponds to a region other than the above pattern. A development process is performed, so that photoresist in the photoresist non-retained region is completely removed, and the thickness of photoresist in the photoresist retained region is constant. The source and drain metal layer in the photoresist non-retained region is completely etched away by an etching process, and the remaining photoresist is lifted off, so as to form the drain electrode, the source electrode and data lines.

Figure 8A:
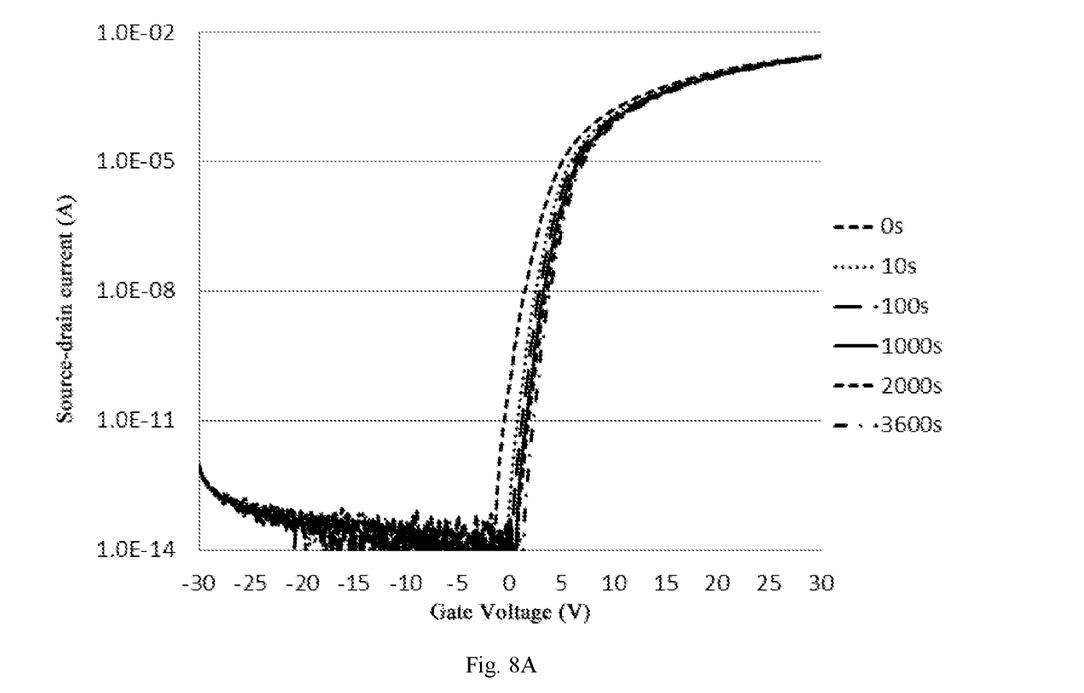
FIG. 8A is a diagram for illustrating the results of stability measurement for a TFT fabricated in an embodiment of the present disclosure.

The measurement of the stability of TFT is conducted, in which the TFT is irradiated by the backlight source for 0, 10, 100, 1000, 2000, 3000 seconds. The results are shown in FIG. 8A, in which the transfer characteristic of the TFT is shown. The experimental results indicate that the TFT which has been irradiated by the backlight source for different durations have substantially the same source-drain current under a same gate voltage. As can be seen, the TFT fabricated in embodiments of the present disclosure shows a small offset in characteristic even after being irradiated for a long time, and has a high stability.

Figure 8B:
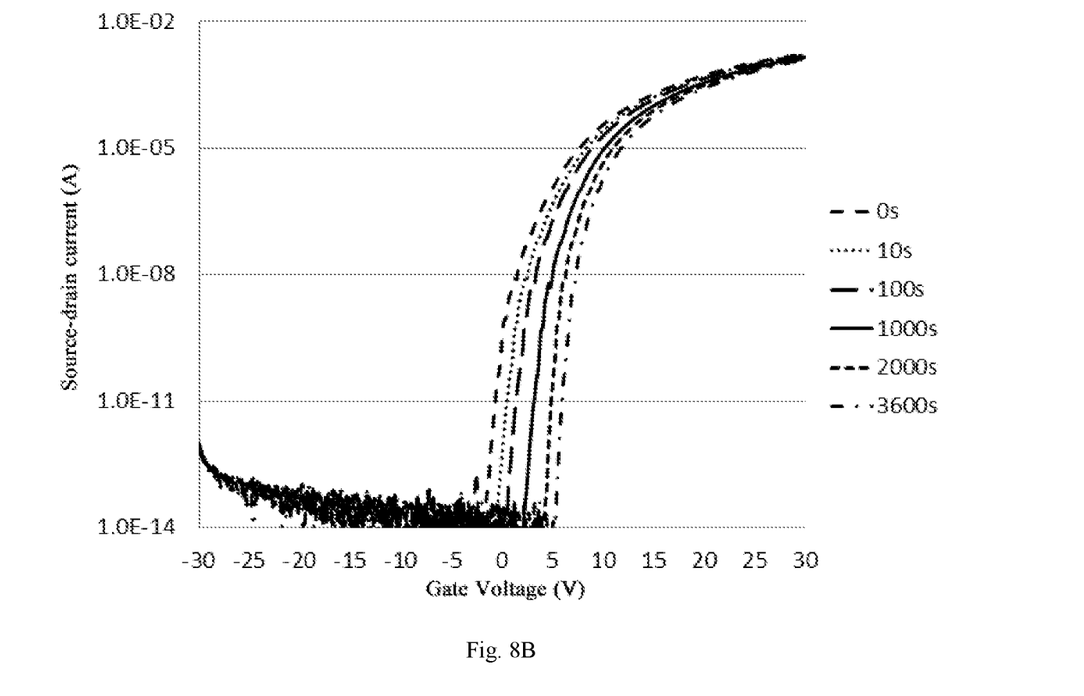
FIG. 8B illustrates the results of stability measurement for a known TFT.

In a comparative example, a measurement of the characteristic of TFT is conducted on a conventional TFT with a flat gate surface, in which the TFT is irradiated by the backlight source for 0, 10, 100, 1000, 2000, 3000 seconds. The results are shown in FIG. 8B. As for the TFT which has been irradiated by the backlight source for different durations, the source-drain current increases under a same gate voltage, especially over 0 V. The experimental results indicate that the existing a-silicon or polycrystalline silicon TFT has a large characteristic offset, and has a stability lower than the TFT in embodiments of the present disclosure.

In an embodiment of the present disclosure, a method for fabricating a TFT comprises the following steps 31-36.

Step 31, a substrate is provided. The substrate can be a flexible substrate, such as polyimide.

Step 32, a gate is formed on the above substrate. In particular, a gate metal layer is deposited on the substrate from step 31 sputtering or thermal evaporation. The gate metal layer has a thickness of about 300~400 nm, and is formed of Cu.

Step 33, the gate metal layer is etched by hydrogen peroxide with a mass concentration of 1.5% for an etching duration of 1 minute, so as to form a gate metal layer comprising an uneven structure on a surface away from the substrate. The surface has a surface roughness Ra of about 20~100 nm. A transparent conductive layer is deposited on the surface of the gate metal layer comprising the rough surface. The transparent conductive layer comprises indium tin oxide. A patterning process is performed on the gate metal layer and the transparent conductive layer, to form a gate with a rough surface and a buffer layer covering the gate.

Step 34, a gate insulating layer is formed on the substrate from step 33. In particular, the gate insulating layer is deposited on the substrate from step 33 by PECVD. The gate insulating layer comprises oxide, nitride, or oxynitride, and the reaction gas comprises $SiH_4$, $NH_3$, $N_2$ or $SiH_2Cl_2$, $NH_3$, $N_2$.

Step 35, an oxide semiconductor layer is deposited on the substrate from step 34. The oxide semiconductor for example comprises indium zinc oxide, zinc tin oxide, or indium gallium zinc oxide.

Step 36, a pattern comprising data lines, a source electrode, and a drain electrode is formed on the substrate from step 35. In particular, a source and drain metal layer is deposited on the substrate from step 35, by magnetron sputtering, thermal evaporation or other film-forming methods. The source and drain metal layer for example comprises metals like Cu, Al, Ag, Mo, Cr, Nd, Ni, Mn, Ti, Ta, W and alloys of these metals. The source and drain metal layer for example is a monolayer structure or multilayer structure, and the multilayer structure for example comprises Cu\Mo, Ti\Cu\Ti, Mo\Al\Mo. A photoresist is coated on the source and drain metal layer and is exposed with a mask, so that the photoresist forms a photoresist non-retained region and a photoresist retained region. The photoresist retained region corresponds to a region where a pattern comprising the source electrode, the drain electrode and data lines is located, and the photoresist non-retained region corresponds to a region other than the above pattern. A development process is performed, so that photoresist in the photoresist non-retained region is completely removed, and the thickness of photoresist in the photoresist retained region is constant. The source and drain metal layer in the photoresist non-retained region is completely etched away by an etching process, and the remaining photoresist is lifted off, so as to form the drain electrode, the source electrode and data lines.

Embodiments of the present disclosure provide a TFT, a method for fabricating the same, a display substrate, and a display device. The gate of the TFT has a rough surface. Since the surface of gate is uneven, the light which has been reflected on the surface of gate will no longer be reflected, or will be directly scattered to other directions. The incident light from the backlight source can not impinge onto the semiconductor layer by continuous reflection. This reduces the possibility that the semiconductor layer is irradiated by light. Especially when the semiconductor material is a metallic oxide, this can reduce the possibility that the metallic oxide semiconductor which is sensitive to light is irradiated by light, and thus inhibit degradation. Since the semiconductor layer is relatively stable, the TFT of this structure has an improved stability.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A thin film transistor, comprising a substrate, a gate, a gate insulating layer, a semiconductor layer, a source, and a drain, wherein the gate comprises a rough surface with a surface roughness about 20.3~100 nm on a side facing the semiconductor layer.

2. The thin film transistor of claim 1, wherein the gate is arranged on the substrate, the gate insulating layer covers the gate and the substrate, the semiconductor layer is arranged on the gate insulating layer, a projection of the semiconductor layer on the substrate falls within a projection of the gate on the substrate, and the source and the drain are arranged on the semiconductor layer.

3. The thin film transistor of claim 1, wherein the semiconductor layer is arranged on the substrate, the source and the drain are arranged on the semiconductor layer, the gate insulating layer covers the source and the drain, the semiconductor layer and the substrate, the gate is arranged on the gate insulating layer, and the projection of the semiconductor layer on the substrate falls within the projection of the gate on the substrate.

4. The thin film transistor of claim 3, wherein a surface of the gate insulating layer facing the gate is rough.

5. The thin film transistor of claim 1, wherein the semiconductor layer comprises a metallic oxide, a-Si or p-Si.

6. The thin film transistor of claim 1, further comprising a buffer layer between the gate and the gate insulating layer.

7. The thin film transistor of claim 6, wherein the buffer layer comprises an electrically conductive material.

8. A display substrate, comprising the thin film transistor of claim 1.

9. A display device, comprising the display substrate of claim 8.

10. A method for fabricating a thin film transistor, comprising:
    forming a gate, a gate insulating layer, a semiconductor layer, a source, and a drain on a substrate, wherein forming the gate comprises forming a gate which comprises a rough surface with a surface roughness about 20.3~100 nm on a side facing the semiconductor layer.

11. The method of claim 10, wherein forming the gate, the gate insulating layer, the semiconductor layer, the source, and the drain comprises:
    forming the gate on the substrate;
    forming the gate insulating layer which covers the gate and the substrate;
    forming the semiconductor layer on the gate insulating layer, wherein a projection of the semiconductor layer on the substrate falls within a projection of the gate on the substrate; and
    forming the source and the drain on the semiconductor layer.

12. The method of claim 11, wherein forming the gate on the substrate comprises:
    depositing a gate metal layer on the substrate;
    micro-etching the gate metal layer to form a rough surface on a side away from the substrate; and
    patterning the gate metal layer to form the gate.

13. The method of claim 10, wherein prior to forming the gate insulating layer, the method further comprises: forming a buffer layer which covers the gate.

14. The method of claim 13, wherein forming the gate and the buffer layer comprises:
    depositing a gate metal layer on a substrate;
    micro-etching the gate metal layer, so that a surface of the gate metal layer on a side away from the substrate is rough;
    depositing an electrically conductive material layer on the surface of the gate metal layer; and
    patterning the gate metal layer and the electrically conductive material layer to form the gate and the buffer layer which covers the gate.

15. The method of claim 12, wherein micro-etching the gate metal layer comprises:
    etching a surface of the gate metal layer on a side away from the substrate with a weak acidic solution or oxidizing agent.

16. The method of claim 15, wherein micro-etching comprises: etching the gate metal layer by using hydrogen peroxide with a mass concentration of about 1~3% for a duration of about 10 seconds~10 minutes.

17. The method of claim 10, wherein forming the gate, the gate insulating layer, the semiconductor layer, the source, and the drain comprises:
    forming the semiconductor layer on the substrate;
    forming the source and the drain on the semiconductor layer;
    forming the gate insulating layer which covers the source, the drain, the semiconductor layer, and the substrate; and
    forming the gate on the gate insulating layer, wherein the projection of the semiconductor layer on the substrate falls within the projection of the gate on the substrate.

18. The method of claim 17, wherein after forming the gate insulating layer, and prior to forming the gate, the method further comprises:
    processing the gate insulating layer with a plasma gas, so that a surface of the gate insulating layer away from the substrate is rough.

* * * * *